(12) United States Patent
Baselmans (10) Patent No.: US 10,627,551 B2
(45) Date of Patent: Apr. 21, 2020

(54) INSPECTION APPARATUS, LITHOGRAPHIC APPARATUS AND METHOD OF MEASURING A PROPERTY OF A SUBSTRATE (71) Applicant: ASML Netherlands B.V., Veldhoven (NL)

(72) Inventor: Wilhelmus Jacobus Baselmans, Eersel (NL)

(73) Assignee: ASML Netherlands B.V., Veldhoven (NL)

( * ) Notice: Subject to any disclaimer, the term of this patent is extended or adjusted under 35 U.S.C. 154(b) by 0 days.

(21) Appl. No.: 15/948,329

(22) Filed: Apr. 9, 2018

(65) Prior Publication Data

US 2018/0239065 A1 Aug. 23, 2018

Related U.S. Application Data

(62) Division of application No. 12/746,055, filed as application No. PCT/EP2008/009887 on Nov. 21, 2008, now abandoned.

(60) Provisional application No. 60/992,585, filed on Dec. 5, 2007.

(51) Int. Cl.
*G03B 27/72* (2006.01)
*G02B 5/00* (2006.01)
*G03F 7/20* (2006.01)

(52) U.S. Cl.
CPC ........... *G02B 5/005* (2013.01); *G03F 7/7055* (2013.01)

(58) Field of Classification Search
CPC ...... G03F 7/7055; G02B 6/3578; G02B 6/353; G02B 6/3552; G02B 5/005; G01J 3/0229; G01J 3/0232
See application file for complete search history.

(56) References Cited

U.S. PATENT DOCUMENTS

| | | | |
|---|---|---|---|
| 5,268,974 A | 12/1993 | Hikita et al. | |
| 5,563,977 A | 10/1996 | Cassarly et al. | |
| 6,753,959 B2 | 6/2004 | Hammer et al. | |
| 2005/0174575 A1 | 8/2005 | Norton et al. | |
| 2006/0033921 A1 | 2/2006 | Den Boef et al. | |
| 2010/0296072 A1 | 11/2010 | Baselmans | |

FOREIGN PATENT DOCUMENTS

| | | |
|---|---|---|
| EP | 1 628 164 A2 | 2/2006 |
| WO | WO 01/61291 A1 | 8/2001 |

OTHER PUBLICATIONS

International Search Report directed to related International Patent Application No. PCT/EP2008/009887, dated Apr. 4, 2009; 2 pages.
International Preliminary Report on Patentability and Written Opinion of the International searching authority directed to related International Patent Application No. PCT/EP2008/009887, dated Jun. 8, 2010; 6 pages.

*Primary Examiner* — Peter B Kim
(74) *Attorney, Agent, or Firm* — Sterne, Kessler, Goldstein & Fox P.L.L.C.

(57) ABSTRACT

A piezo-electric material is placed adjacent to the path of the radiation beam such that, when power is applied to the piezo-electric material it rotates into the path of the radiation beam to block it. A smaller and lighter radiation beam shutter therefore results.

20 Claims, 5 Drawing Sheets

INSPECTION APPARATUS, LITHOGRAPHIC APPARATUS AND METHOD OF MEASURING A PROPERTY OF A SUBSTRATE

CROSS-REFERENCE TO RELATED APPLICATIONS

This application is a divisional of U.S. patent application Ser. No. 12/746,055, filed on Jul. 27, 2010, and claims the benefit through International Application No. PCT/EP2008/009887, filed on Nov. 21, 2008 to U.S. Provisional Application No. 60/992,585, filed on Dec. 5, 2007, each of which are incorporated herein by reference in their entireties.

FIELD

The present invention relates to methods of inspection usable, for example, in the manufacture of devices by lithographic techniques and to methods of manufacturing devices using lithographic techniques.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. including part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

In order to monitor the lithographic process, it is desirable to measure parameters of the patterned substrate, for example the overlay error between successive layers formed in or on it. There are various techniques for making measurements of the microscopic structures formed in lithographic processes, including the use of scanning electron microscopes and various specialized tools. One form of specialized inspection tool is a scatterometer in which a beam of radiation is directed onto a target on the surface of the substrate and properties of the scattered or reflected beam are measured. By comparing the properties of the beam before and after it has been reflected or scattered by the substrate, the properties of the substrate can be determined. This can be done, for example, by comparing the reflected beam with data stored in a library of known measurements associated with known substrate properties. Two main types of scatterometer are known. Spectroscopic scatterometers direct a broadband radiation beam onto the substrate and measure the spectrum (intensity as a function of wavelength) of the radiation scattered into a particular narrow angular range. Angularly resolved scatterometers use a monochromatic radiation beam and measure the intensity of the scattered radiation as a function of angle.

The radiation beam used in such apparatus often needs to be switched off or on and the simplest and fastest method of doing this is by shutting off the radiation beam. One method of shutting off the radiation beam is to use a safety shutter, often operated using a solenoid. However, a solenoid has a limited lifespan of between 2 and 50 million cycles and may dissipate a large amount of energy. Another method of shutting of the radiation beam is to use a wheel with some cut out portions. Depending on which part of the wheel is in the path of the radiation beam the radiation beam may be blocked, or allowed to pass. The wheel is usually operated by a motor. Another method of shutting of the radiation is to use an optical shutter but this disturbs the radiation beam itself. Additionally, all of these devices for shutting off a radiation beam generally occupy a large volume compared to the radiation beam itself, are heavy and have a slow response time and a short lifetime.

SUMMARY

It is desirable to provide an alternative device for shutting off the radiation beam which has a faster response and longer lifetime and occupies a smaller volume.

According to an aspect of the invention, there is provided an inspection apparatus, lithographic apparatus, the apparatus including an illumination system configured to condition a radiation beam; a radiation projector configured to project radiation onto the substrate; a high numerical aperture lens; a detector configured to detect the radiation beam reflected from a surface of the substrate; and a piezo-electric material configured to move into or out of the path of the radiation beam when a signal to the piezo-electric material is changed.

According to a further aspect of the invention, there is provided an apparatus configured to project an image of a substrate, the apparatus including a radiation projector configured to project radiation onto the substrate; a high numerical aperture lens through which the radiation is projected; and a piezo-electric material configured to move into or out of the path of the radiation beam when a signal to the piezo-electric material is changed.

According to a further aspect of the invention, there is provided a method of measuring a property of a substrate including projecting radiation onto a substrate using a radiation projector; detecting the radiation reflected from the substrate, the reflected radiation being indicative of the properties to be measured; and blocking the path of the radiation by changing the signal applied to a piezo-electric material.

According to an aspect of the invention, there is provided a lithographic apparatus including an illumination system configured to condition a beam of radiation; a patterning device support configured to support a patterning device, the patterning device configured to pattern the beam of radiation to form a patterned beam of radiation; a substrate table configured to hold a substrate; a projection system configured to project the patterned beam of radiation onto a target portion of the substrate; and an inspection apparatus configured to measure a property of the substrate, the inspection apparatus including an illumination system configured to condition a radiation beam; a radiation projector configured to project the radiation beam onto the substrate; a high numerical aperture lens; a detector configured to detect the radiation beam reflected from a surface of the substrate; and a piezo-electric material configured to move into or out of the path of the radiation beam when a signal to the piezo-electric material is changed.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1A:
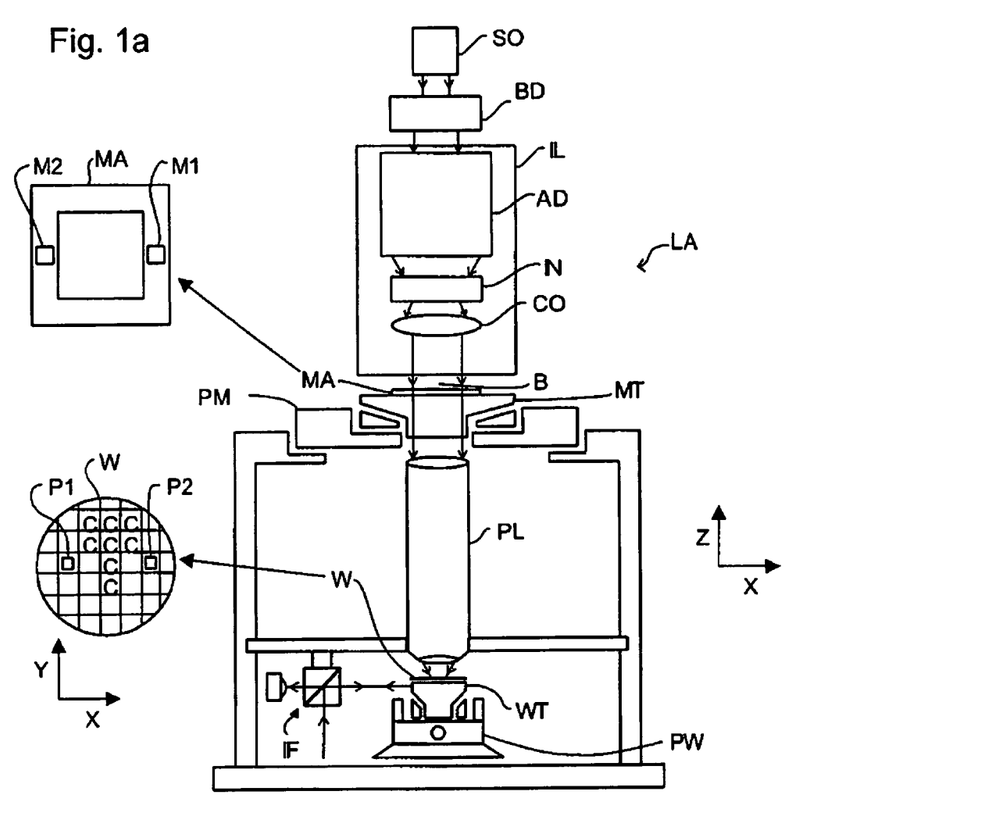
FIGS. 1a-1b depict a lithographic apparatus according to an embodiment of the invention.

FIG. 1 schematically depicts a lithographic apparatus. The apparatus includes an illumination system (illuminator) IL configured to condition a radiation beam B (e.g. UV radiation or DUV radiation); a patterning device support or support structure (e.g. a mask table) MT constructed to support a patterning device (e.g. a mask) MA and connected to a first positioner PM configured to accurately position the patterning device in accordance with certain parameters; a substrate table (e.g. a wafer table) WT constructed to hold a substrate (e.g. a resist-coated wafer) W and connected to a second positioner PW configured to accurately position the substrate in accordance with certain parameters; and a projection system (e.g. a refractive projection lens system) PL configured to project a pattern imparted to the radiation beam B by patterning device MA onto a target portion C (e.g. including one or more dies) of the substrate W.

The illumination system may include various types of optical components, such as refractive, reflective, magnetic, electromagnetic, electrostatic or other types of optical components, or any combination thereof, for directing, shaping, or controlling radiation.

The patterning device support or support structure holds the patterning device in a manner that depends on the orientation of the patterning device, the design of the lithographic apparatus, and other conditions, such as for example whether or not the patterning device is held in a vacuum environment. The support structure can use mechanical, vacuum, electrostatic or other clamping techniques to hold the patterning device. The support structure may be a frame or a table, for example, which may be fixed or movable as required. The support structure may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam, which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

The lithographic apparatus may also be of a type wherein at least a portion of the substrate may be covered by a liquid having a relatively high refractive index, e.g. water, so as to fill a space between the projection system and the substrate. An immersion liquid may also be applied to other spaces in the lithographic apparatus, for example, between the mask and the projection system. Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

Referring to FIG. 1a, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD including, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may include an adjuster AD for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may include various other components, such as an integrator IN and a condenser CO. The illuminator may be used to condition the radiation beam, to have a desired uniformity and intensity distribution in its cross-section.

The radiation beam B is incident on the patterning device (e.g., mask) MA, which is held on the patterning device support or support structure (e.g., mask table) MT, and is patterned by the patterning device. Having traversed the patterning device mask MA, the radiation beam B passes through the projection system PL, which focuses the beam onto a target portion C of the substrate W. With the aid of the second positioner PW and position sensor IF (e.g. an interferometric device, linear encoder, 2-D encoder or capacitive sensor), the substrate table WT can be moved accurately, e.g. so as to position different target portions C in the path of the radiation beam B. Similarly, the first positioner PM and another position sensor (which is not explicitly depicted in FIG. 1) can be used to accurately position the mask MA with respect to the path of the radiation beam B, e.g. after mechanical retrieval from a mask library, or during a scan. In general, movement of the patterning device support or support structure (e.g. mask table) MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the support structure (e.g. mask table) MT may be connected to a short-stroke actuator only, or may be fixed. Patterning device (e.g. mask) MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the patterning device (e.g. mask) MA, the mask alignment marks may be located between the dies.

The depicted apparatus could be used in at least one of the following modes:

1. In step mode, the support structure (e.g. mask table) MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the support structure (e.g. mask table) MT and the substrate table WT are scanned synchronously while a pattern imparted to the radiation beam is projected onto a target portion C (i.e. a single dynamic exposure). The velocity and direction of the substrate table WT relative to the support structure (e.g. mask table) MT may be determined by the (de-)magnification and image reversal characteristics of the projection system PL. In scan mode, the maximum size of the exposure field limits the width (in the non-scanning direction) of the target portion in a single dynamic exposure, whereas the length of the scanning motion determines the height (in the scanning direction) of the target portion.

3. In another mode, the support structure (e.g. mask table) MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Figure 1B:
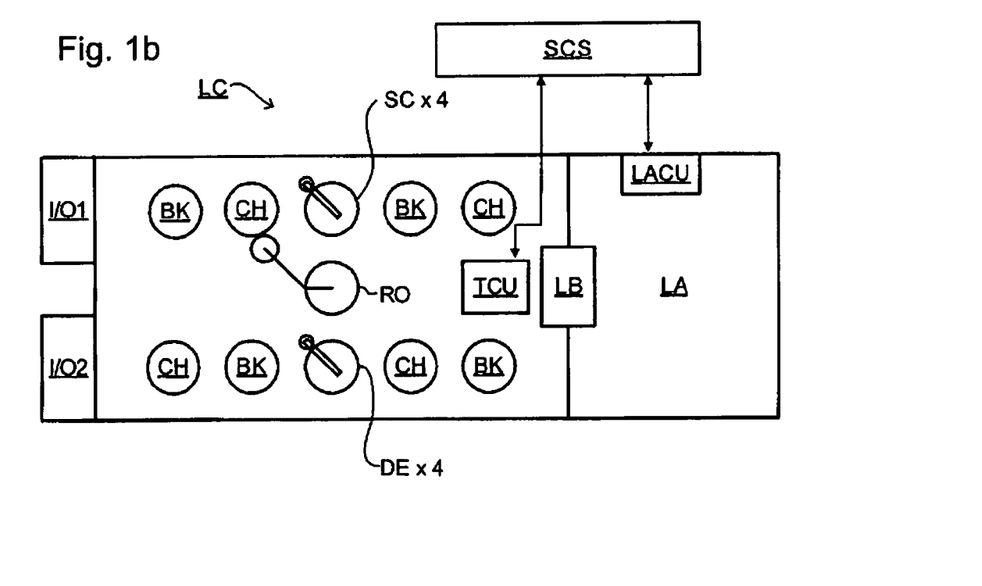

As shown in FIG. 1b, the lithographic apparatus LA forms part of a lithographic cell LC, also sometimes referred to a lithocell or cluster, which also includes apparatus to perform pre- and post-exposure processes on a substrate. Conventionally these include spin coaters SC to deposit resist layers, developers DE to develop exposed resist, chill plates CH and bake plates BK. A substrate handler, or robot, RO picks up substrates from input/output ports I/O1, I/O2, moves them between the different process apparatus and delivers then to the loading bay LB of the lithographic apparatus. These devices, which are often collectively referred to as the track, are under the control of a track control unit TCU which is itself controlled by the supervisory control system SCS, which also controls the lithographic apparatus via lithography control unit LACU. Thus, the different apparatus can be operated to maximize throughput and processing efficiency.

In order that the substrates that are exposed by the lithographic apparatus are exposed correctly and consistently, it is desirable to inspect exposed substrates to measure properties such as overlay errors between subsequent layers, line thicknesses, critical dimensions (CD), etc. If errors are detected, adjustments may be made to exposures of subsequent substrates, especially if the inspection can be done soon and fast enough that other substrates of the same batch are still to be exposed. Also, already exposed substrates may be stripped and reworked—to improve yield—or discarded—thereby avoiding performing exposures on substrates that are known to be faulty. In a case where only some target portions of a substrate are faulty, further exposures can be performed only on those target portions which are good.

An inspection apparatus is used to determine the properties of the substrates, and in particular, how the properties of different substrates or different layers of the same substrate vary from layer to layer. The inspection apparatus may be integrated into the lithographic apparatus LA or the lithocell LC or may be a stand-alone device. To enable most rapid measurements, it is desirable that the inspection apparatus measure properties in the exposed resist layer immediately after the exposure. However, the latent image in the resist has a very low contrast—there is only a very small difference in refractive index between the parts of the resist which have been exposed to radiation and those which have not—and not all inspection apparatus have sufficient sensitivity to make useful measurements of the latent image. Therefore measurements may be taken after the post-exposure bake step (PEB) which is customarily the first step carried out on exposed substrates and increases the contrast between exposed and unexposed parts of the resist. At this stage, the image in the resist may be referred to as semi-latent. It is also possible to make measurements of the developed resist image—at which point either the exposed or unexposed parts of the resist have been removed—or after a pattern transfer step such as etching. The latter possibility limits the possibilities for rework of faulty substrates but may still provide useful information.

Figure 2:
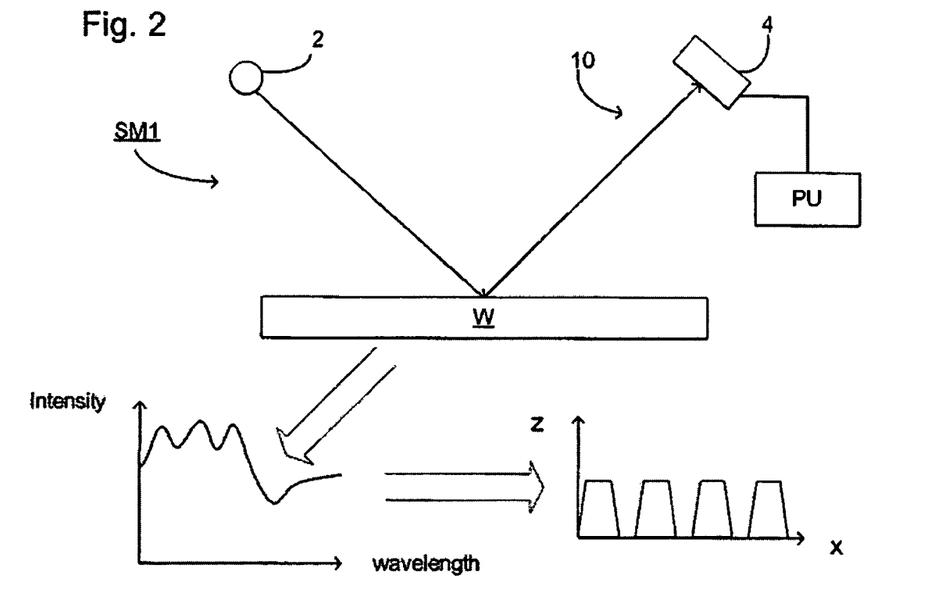
FIG. 2 depicts a lithographic cell or cluster according to an embodiment of the invention.

FIG. 2 depicts a scatterometer SM1 which may be used in an embodiment of the present invention. It includes a broadband (white light) radiation projector 2 which projects radiation onto a substrate W. The reflected radiation is passed to a spectrometer detector 4, which measures a spectrum 10 (intensity as a function of wavelength) of the specular reflected radiation. From this data, the structure or profile giving rise to the detected spectrum may be reconstructed by processing unit PU, e.g. by Rigorous Coupled Wave Analysis and non-linear regression or by comparison with a library of simulated spectra as shown at the bottom of FIG. 2. In general, for the reconstruction the general form of the structure is known and some parameters are assumed from knowledge of the process by which the structure was made, leaving only a few parameters of the structure to be determined from the scatterometry data. Such a scatterometer may be configured as a normal-incidence scatterometer or an oblique-incidence scatterometer.

Figure 3:
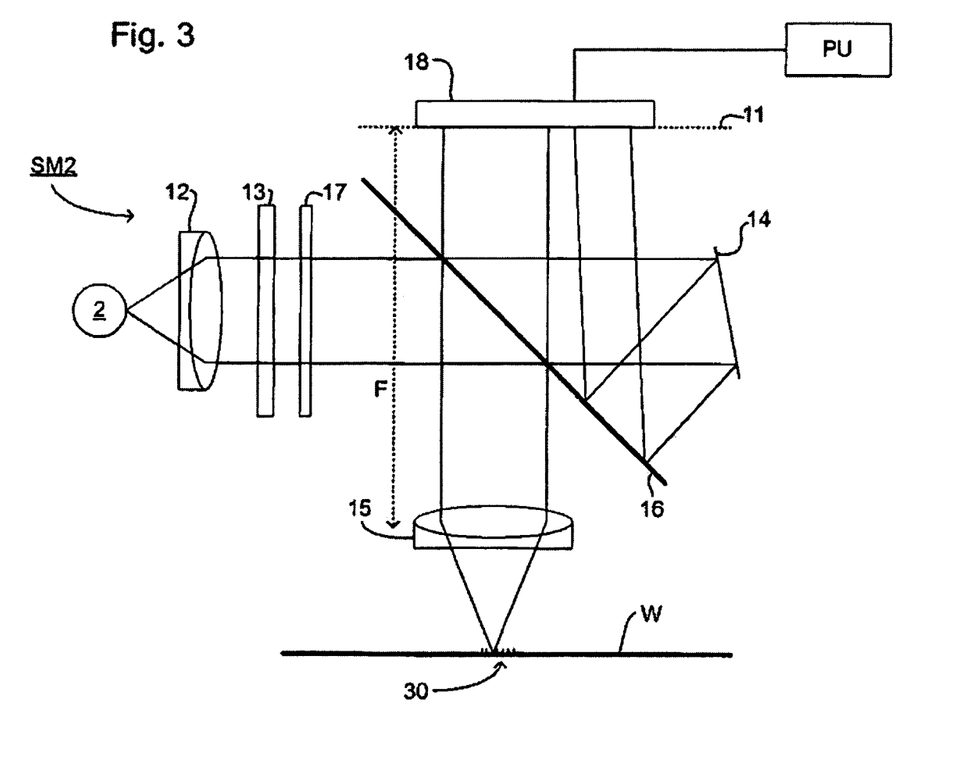
FIG. 3 depicts a scatterometer according to an embodiment of the invention.

Another scatterometer SM2 that may be used in an embodiment of the present invention is shown in FIG. 3. In this device, the radiation emitted by radiation source 2 is focused using lens system 12 through interference filter 13 and polarizer 17, reflected by partially reflected surface 16 and is focused onto substrate W via a microscope objective lens 15, which has a high numerical aperture (NA), preferably at least 0.9 and more preferably at least 0.95. Immersion scatterometers may even have lenses with numerical apertures over 1. The reflected radiation then transmits through partially reflective surface 16 into a detector 18 in order to have the scatter spectrum detected. The detector may be located in the back-projected pupil plane 11, which is at the focal length of the lens system 15, however the pupil plane may instead be re-imaged with auxiliary optics (not shown) onto the detector. The pupil plane is the plane in which the radial position of radiation defines the angle of incidence and the angular position defines azimuth angle of the radiation. The detector is preferably a two-dimensional detector so that a two-dimensional angular scatter spectrum of a substrate target 30 can be measured. The detector 18 may be, for example, an array of CCD or CMOS sensors, and may use an integration time of, for example, 40 milliseconds per frame.

A reference beam is often used for example to measure the intensity of the incident radiation. To do this, when the radiation beam is incident on the beam splitter 16 part of it is transmitted through the beam splitter as a reference beam towards a reference mirror 14. The reference beam is then projected onto a different part of the same detector 18.

A set of interference filters 13 is available to select a wavelength of interest in the range of, say, 405-790 nm or even lower, such as 200-300 nm. The interference filter may be tunable rather than including a set of different filters. A grating could be used instead of interference filters.

The detector 18 may measure the intensity of scattered light at a single wavelength (or narrow wavelength range), the intensity separately at multiple wavelengths or integrated over a wavelength range. Furthermore, the detector may separately measure the intensity of transverse magnetic- and transverse electric-polarized light and/or the phase difference between the transverse magnetic- and transverse electric-polarized light.

Using a broadband radiation source (i.e. one with a wide range of light frequencies or wavelengths—and therefore of colors) is possible, which gives a large etendue, allowing the mixing of multiple wavelengths. The plurality of wavelengths in the broadband preferably each has a bandwidth of a and a spacing of at least $2\delta\lambda$ (i.e. twice the bandwidth). Several "sources" of radiation can be different portions of an extended radiation source which have been split using fiber bundles. In this way, angle resolved scatter spectra can be measured at multiple wavelengths in parallel. A 3-D spectrum (wavelength and two different angles) can be measured, which contains more information than a 2-D spectrum. This allows more information to be measured which increases metrology process robustness. This is described in more detail in EP1,628,164A.

The target 30 on substrate W may be a grating, which is printed such that after development, the bars are formed of solid resist lines. The bars may alternatively be etched into the substrate. This pattern is sensitive to chromatic aberrations in the lithographic projection apparatus, particularly the projection system PL, and illumination symmetry and the presence of such aberrations will manifest themselves in a variation in the printed grating. Accordingly, the scatterometry data of the printed gratings is used to reconstruct the gratings. The parameters of the grating, such as line widths and shapes, may be input to the reconstruction process, performed by processing unit PU, from knowledge of the printing step and/or other scatterometry processes.

Figure 4A:
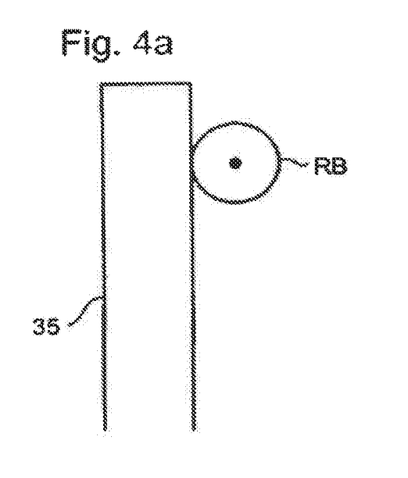
FIGS. 4a and 4b depict a shutter according to an embodiment of the invention.
Figure 4B:
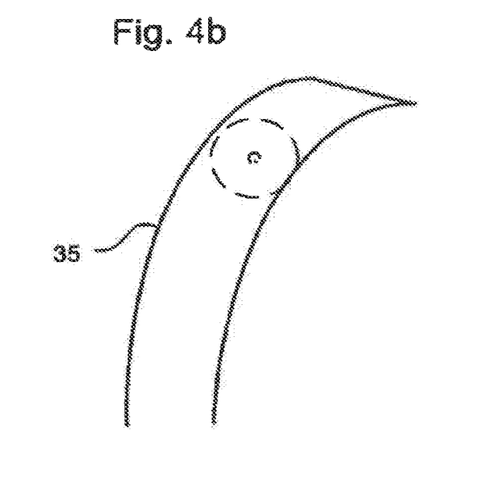

FIGS. 4a and 4b depict a device configured to shut off a radiation beam according to an embodiment of the invention. This device may be referred to as a shutter. A piezo-electric material, 35 is arranged adjacent to the path of the radiation beam, RB. FIG. 4a depicts the device when no voltage is applied to the piezo-electric material. To shut off the radiation beam a voltage is applied to the piezo-electric material which causes the end of the piezo-electric material to rotate into the path of the radiation beam, thus blocking it, as shown in FIG. 4b. The same device is shown in side elevation blocking the path of the radiation beam in FIG. 5.

Figure 5:
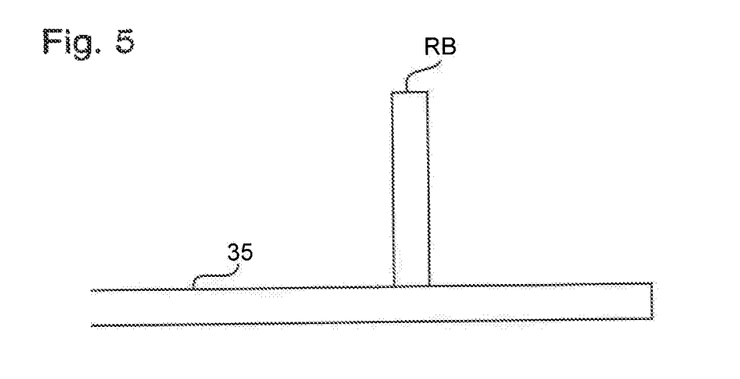
FIG. 5 depicts the blocking of a radiation beam according to an embodiment of the invention.

This device may be placed at any convenient position in the apparatus, although it should be arranged such that it can completely block the path of the projection beam. Consequently, a convenient location may be at the exit of an optic fiber. Furthermore, it occupies only a small volume and thus if two or more radiation beams operate in close proximity to each other it is still possible to shut them off with this small device. Furthermore, as it is a single piece of piezo-electric material it is lightweight, can operate fast and has a long lifetime.

Although the embodiment described above relates to the rotation of the piezo-electric material and type of motion which brings the piezo-electric material into and out of the path of the projection beam would be suitable.

Figure 6A:
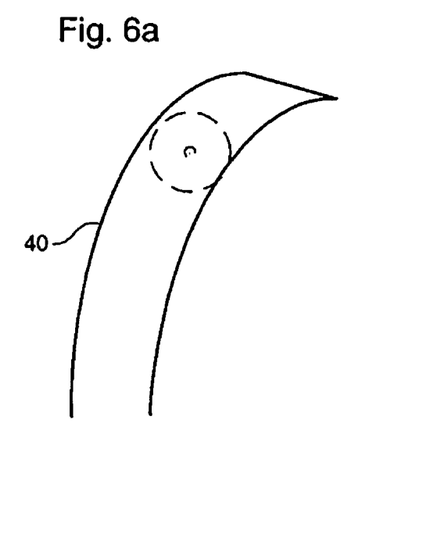
FIGS. 6a and 6b depict a shutter according to an embodiment of the invention.
Figure 6B:
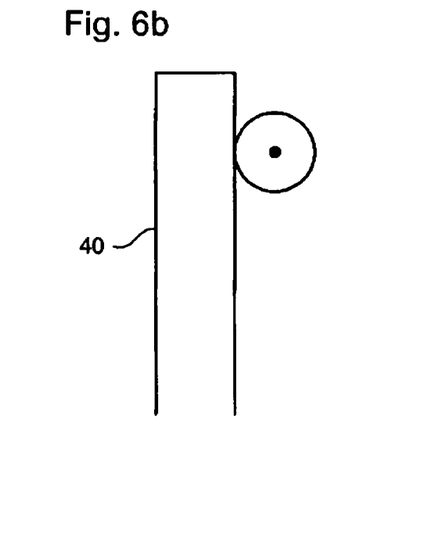

A shutter according to an embodiment is shown in FIGS. 6a and 6b. In this embodiment, the shutter includes a piezo-electric material 40 that is arranged in the path of the radiation beam RB when no voltage is applied to it, as shown in FIG. 6a. When a voltage is applied to the radiation beam it rotates out of the path of the radiation beam to allow it to pass, as shown in FIG. 6b. This embodiment may be more useful if the radiation beam is to be shut off for a higher proportion of time than it is used.

Any other arrangement or system in which the piezo-electric material is moved into the path of the projection beam at a given voltage is also possible. In a preferred embodiment the piezo-electric material is moved into the path of the projection beam at a voltage +V, for example +30V and out of the path of the projection beam at a voltage −V, for example −30V. The use of both positive and negative voltages enables a larger amplitude of movement to be achieved. When the system is not in operation 0V is preferably applied to the piezo-electric material to preserve its longevity.

Figure 7A:
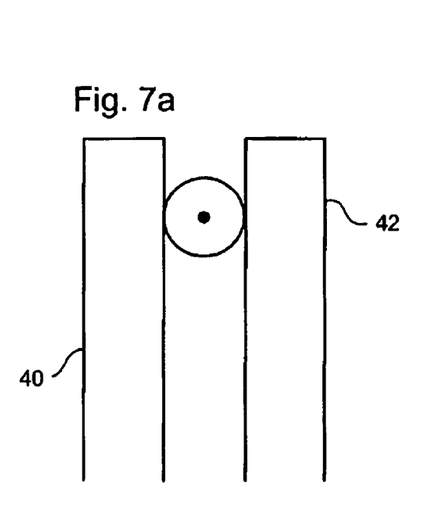
FIGS. 7a and 7b depict a shutter according to an embodiment of the invention.
Figure 7B:
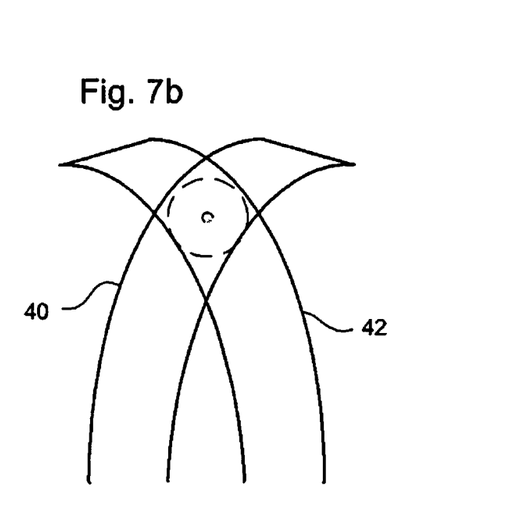

A shutter according to an embodiment is shown in FIGS. 7a and 7b. In this embodiment, the shutter includes two piezo-electric materials, 40 and 42, placed either side of the projection beam. As can be seen from FIG. 7b, both piezo-electric materials rotate into the path of the projection beam when a voltage is applied to them. It will be appreciated by a person skilled in the art that the two piezo-electric materials could equally be arranged to rotate out of the path of the projection beam when power is applied to them, as in FIGS. 6a-b.

Figure 8:
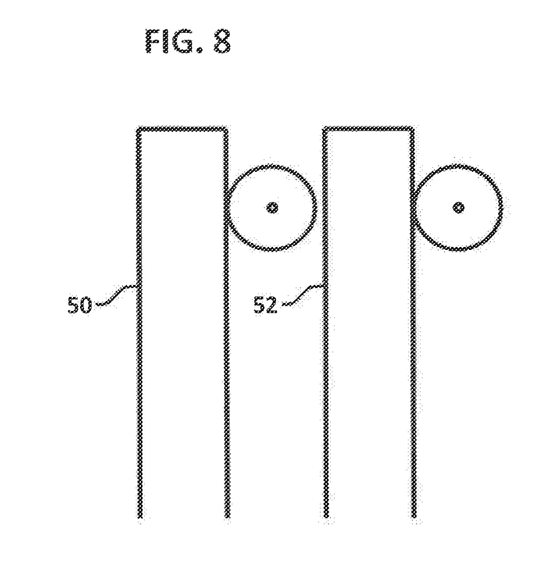
FIG. 8 depicts a shutter according to an embodiment.

In an embodiment, for example the embodiment of FIG. 8, the inspection device may include a second illumination system configured to condition a second radiation beam and a second piezo-electric material 52 configured to move into or out of the path of the second beam of radiation when a signal to the second piezo-electric material is changed.

Although the embodiments described above discuss the voltage being switched on and off, such a change in the configuration of the piezo-electric material could be achieved by any suitable change in a signal to the material, and is not limited to switching on and off of the voltage.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

The descriptions above are intended to be illustrative, not limiting. Thus, it will be apparent to one skilled in the art that modifications may be made to the invention as described without departing from the scope of the claims set out below.

Further embodiments are defined in the subsequent numbered clauses:

1. An inspection apparatus configured to measure a property of a substrate, the apparatus comprising:
   an illumination system configured to condition a radiation beam;
   a radiation projector configured to project the radiation beam onto the substrate;
   a high numerical aperture lens;
   a detector configured to detect the radiation beam reflected from a surface of the substrate; and
   a piezo-electric material configured to move into or out of the path of the radiation beam when a signal to the piezo-electric material is changed.

2. An inspection apparatus according to clause 1, wherein the piezo-electric material is arranged such that at least a portion of the piezo-electric material moves into the path of the radiation beam when the signal to the piezo-electric material is increased.

3. An inspection apparatus according to clause 1, wherein the piezo-electric material is arranged such that at least a portion of the piezo-electric material moves into the path of the radiation beam when the signal to the piezo-electric material is decreased.

4. An inspection apparatus according to clause 1, wherein the piezo-electric material moves into and out of the path of the radiation beam by rotation.

5. An inspection apparatus according to clause 1, further comprising an additional piezo-electric material configured to move into or out of the path of the radiation beam when a signal to the additional piezo-electric material is changed.

6. An inspection apparatus according to clause 1, further comprising an additional illumination system configured to condition an additional radiation beam and an additional piezo-electric material configured to move into or out of the path of the additional radiation beam when a signal to the additional piezo-electric material is changed.

7. An inspection apparatus according to clause 1, wherein the signal comprises a voltage applied to the piezo-electric material.

8. A lithographic apparatus comprising:
   an illumination system configured to condition a beam of radiation;
   a patterning device support configured to support a patterning device, the patterning device configured to pattern the beam of radiation to form a patterned beam of radiation;
   a substrate table configured to hold a substrate;
   a projection system configured to project the patterned beam of radiation onto a target portion of the substrate; and
   an inspection apparatus configured to measure a property of the substrate, the inspection apparatus comprising:
      an illumination system configured to condition a radiation beam;
      a radiation projector configured to project the radiation beam onto the substrate;
      a high numerical aperture lens;
      a detector configured to detect the radiation beam reflected from a surface of the substrate; and
      a piezo-electric material configured to move into or out of the path of the radiation beam when a signal to the piezo-electric material is changed.

9. A lithographic apparatus according to clause 8, wherein the piezo-electric material is arranged such that at least a portion of the piezo-electric material moves into the path of the radiation beam when the signal to the piezo-electric material is increased.

10. A lithographic apparatus according to clause 8, wherein the piezo-electric material is arranged such that at least a portion of the piezo-electric material moves into the path of the radiation beam when the signal to the piezo-electric material is decreased.

11. A lithographic apparatus according to clause 8, wherein the piezo-electric material moves into and out of the path of the radiation beam by rotation.

12. A lithographic apparatus according to clause 8, further comprising an additional piezo-electric material configured to move into or out of the path of the radiation beam when a signal to the additional piezo-electric material is changed.

13. An apparatus configured to project an image of a substrate, the apparatus comprising:

a radiation projector configured to project radiation onto the substrate;

a high numerical aperture lens through which the radiation is projected; and a piezo-electric material configured to move into or out of the path of the radiation beam when a signal to the piezo-electric material is changed.

14. A method of measuring a property of a substrate comprising:

projecting radiation onto a substrate;

detecting the radiation reflected from the substrate, the reflected radiation being indicative of the properties to be measured; and blocking the path of the radiation by changing a signal applied to a piezo-electric material.

15. A method according to clause 14, wherein the piezo-electric material is arranged such that at least a portion of the piezo-electric material moves into the path of the radiation when the signal to the piezo-electric material is increased.

16. A method according to clause 14, wherein the piezo-electric material is arranged such that at least a portion of the piezo-electric material moves into the path of the radiation when the signal to the piezo-electric material is decreased.

17. A method according to clause 14, wherein the piezo-electric material moves into and out of the path of the radiation by rotation.

18. A method according to clause 14, further comprising blocking the path of the radiation by changing a signal applied to an additional piezo-electric material, the additional piezo-electric material configured to move into or out of the path of the radiation when a signal to the additional piezo-electric material is changed.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g. having a wavelength of or about 365, 355, 248, 193, 157 or 126 nm) and extreme ultra-violet (EUV) radiation (e.g. having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g. semiconductor memory, magnetic or optical disk) having such a computer program stored therein.

The invention claimed is:

1. An inspection apparatus, comprising:

a projector configured to project a radiation beam onto a substrate;

a detector configured to detect the radiation beam after reflection from a surface of the substrate;

a first shutter comprised of piezo-electric material, wherein in a first state the first shutter is configured to move into a path of the radiation beam in response to increasing a signal applied to the first shutter; and a second shutter comprised of piezo-electric material, wherein in the first state the second shutter is configured to move into the path of the radiation beam in response to increasing a signal applied to the second shutter, wherein portions of the first and second shutters are configured to overlap after moving into the path of the radiation beam.

2. The inspection apparatus of claim 1, wherein in the first state the first and second shutters are configured to block the radiation beam.

3. The inspection apparatus of claim 1, wherein portions of the first and second shutters are arranged to move into the path of the radiation beam in response to increasing a voltage applied to the shutter to a non-zero voltage.

4. The inspection apparatus of claim 3, wherein the non-zero voltage is +30 V.

5. The inspection apparatus of claim 1, wherein portions of the first and second shutters are arranged to move out of the path of the radiation beam in response to decreasing a voltage applied to the shutter to a non-zero voltage.

6. The inspection apparatus of claim 5, wherein the non-zero voltage is −30 V.

7. The inspection apparatus of claim 1, wherein the first and second shutters move into and out of the path of the radiation beam by rotation.

8. A lithographic apparatus comprising:

an illumination system configured to condition a first beam of radiation;

a patterning device support configured to support a patterning device, the patterning device configured to pattern the first beam of radiation to form a patterned beam of radiation;

a substrate table configured to hold a substrate;

a projection system configured to project the patterned first beam of radiation onto a target portion of the substrate; and an inspection apparatus configured to measure a property of the substrate, the inspection apparatus comprising:

a projector configured to project a second radiation beam onto the substrate;

a detector configured to detect the second radiation beam after reflection from a surface of the substrate; and a first shutter comprised of piezo-electric material, wherein in a first state the first shutter is configured to move into a path of the second radiation beam in response to increasing a signal applied to the first shutter; and a second shutter comprised of piezo-electric material, wherein in the first state the second shutter is configured to move into the path of the second radiation beam in response to increasing a signal applied to the second shutter, wherein portions of the first and second shutters are configured to overlap after moving into the path of the radiation beam.

9. The lithographic apparatus of claim 8, wherein in the first state the first and second shutters are configured to block the second radiation beam.

10. The lithographic apparatus of claim 8, wherein portions of the first and second shutters are arranged to move into the path of the second radiation beam in response to increasing a voltage applied to the shutter to a non-zero voltage.

11. The lithographic apparatus of claim 10, wherein the non-zero voltage is +30 V.

12. The lithographic apparatus of claim 8, wherein portions of the first and second shutters are arranged to move out of the path of the second radiation beam in response to increasing a voltage applied to the shutter to a non-zero voltage.

13. The lithographic apparatus of claim 12, wherein the non-zero voltage is −30 V.

14. The lithographic apparatus of claim 8, wherein the first and second shutters move into and out of the path of the second radiation beam by rotation.

15. An apparatus comprising:
a high numerical aperture lens;
a projector configured to project a radiation beam onto a substrate through the high numerical aperture lens; and
a first shutter comprised of piezo-electric material, wherein in a first state the first shutter is configured to move into a path of the radiation beam in response to increasing a signal applied to the first shutter; and
a second shutter comprised of piezo-electric material, wherein in the first state the second shutter is configured to move into the path of the radiation beam in response to increasing a signal applied to the second shutter,
wherein portions of the first and second shutters are configured to overlap after moving into the path of the radiation beam.

16. The apparatus of claim 15, wherein in the first state the first and second shutters are configured to block the radiation beam.

17. The apparatus of claim 15, wherein portions of the first and second shutters are arranged to move into the path of the radiation beam in response to increasing a voltage applied to the shutter to a non-zero voltage.

18. The apparatus of claim 17, wherein the non-zero voltage is +30 V.

19. The apparatus of claim 15, wherein portions of the first and second shutters are arranged to move out of the path of the radiation beam in response to decreasing a voltage applied to the shutter to a non-zero voltage.

20. The apparatus of claim 15, wherein the non-zero voltage is −30 V.

* * * * *